US008993952B2

(12) United States Patent
Takemoto et al.

(10) Patent No.: US 8,993,952 B2
(45) Date of Patent: Mar. 31, 2015

(54) TRANSIMPEDANCE AMPLIFIER, SEMICONDUCTOR DEVICE, AND OPTICAL MODULE TO INCLUDE AN ADDING CIRCUIT FOR ADDING FIRST AND SECOND CURRENT VARIATION

(75) Inventors: Takashi Takemoto, Fuchu (JP); Hiroki Yamashita, Hachioji (JP); Shinji Tsuji, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 316 days.

(21) Appl. No.: 13/546,382

(22) Filed: Jul. 11, 2012

(65) Prior Publication Data

US 2013/0016748 A1 Jan. 17, 2013

(30) Foreign Application Priority Data

Jul. 12, 2011 (JP) .................. 2011-153933

(51) Int. Cl.
*H01J 40/14* (2006.01)
*H03F 3/08* (2006.01)
*H03F 1/02* (2006.01)
*H03F 1/08* (2006.01)

(52) U.S. Cl.
CPC .............. *H03F 3/085* (2013.01); *H03F 1/0222* (2013.01); *H03F 1/0233* (2013.01); *H03F 1/083* (2013.01); *H03F 3/087* (2013.01); *H03F 2200/372* (2013.01); *H03F 2200/504* (2013.01); *H03F 2200/78* (2013.01)
USPC ..................................... 250/214 R; 250/214 A

(58) Field of Classification Search
USPC ................. 250/214 A, 214 LA, 214 R, 214.1, 250/214 LS, 214 AG, 214 C, 214 DC; 330/123, 199, 200, 250, 253, 264, 269, 330/297; 348/300, 307, 308, 309; 327/514–516
See application file for complete search history.

(56) References Cited

U.S. PATENT DOCUMENTS 5,459,311 A * 10/1995 Brosnan ................... 250/214 C
6,952,005 B2 * 10/2005 Doppke et al. ............ 250/214 R

OTHER PUBLICATIONS

Sung Min Park et al., "1.25-Gb/s Regulated Cascode CMOS Transimpedance Amplifier for Gigabit Ethernet Applications", IEEE Journal of Solid-State Circuits, vol. 39, No. 1, Jan. 2004, pp. 112-121.

* cited by examiner

*Primary Examiner* — Georgia Y Epps
*Assistant Examiner* — Don Williams
(74) *Attorney, Agent, or Firm* — Miles & Stockbridge P.C.

(57) ABSTRACT

An optical module including a transimpedance amplifier capable of realizing a high-speed and high-quality receiving operation is provided. A transimpedance amplifier includes: a pre-amplifier using a single-end current signal as an input and converting the single-end current signal to a single-end voltage signal; an automatic decision threshold control detecting a center electric potential of the single-end voltage signal serving as an output of the pre-amplifier; a post-amplifier differentiating and amplifying the single-end voltage signal of the output of the pre-amplifier; and a power circuit supplying power to the pre-amplifier. Particularly, in accordance with an input voltage signal or an output voltage signal of the pre-amplifier, the power circuit outputs a varied current that flows to a supply terminal of the pre-amplifier and a varied current having a phase opposite to that of the varied current. Thus, the power supply current change is cancelled out.

19 Claims, 9 Drawing Sheets

TRANSIMPEDANCE AMPLIFIER, SEMICONDUCTOR DEVICE, AND OPTICAL MODULE TO INCLUDE AN ADDING CIRCUIT FOR ADDING FIRST AND SECOND CURRENT VARIATION

CROSS-REFERENCE TO RELATED APPLICATION

The present application claims priority from Japanese Patent Application No. 2011-153933 filed on Jul. 12, 2011, the content of which is hereby incorporated by reference into this application.

TECHNICAL FIELD OF THE INVENTION

The present invention relates to an optical module including a transimpedance amplifier and to an optical communication apparatus including the module. The present invention particularly relates to technique effectively applied to an optical communication apparatus such as a router device or a server device and to an optical module which is one of the parts of the optical communication apparatus and carries out optical communication by using a laser diode and a photo diode.

BACKGROUND OF THE INVENTION

For example, the document "1.25-Gb/s Regulated Cascode CMOS Transimpedance Amplifier for Gigabit Ethernet (registered trade name) Applications", IEEE JOURNAL OF SOLID-STATE CIRCUITS, VOL. 39, NO. 1, JANUARY 2004 (Non-Patent Document 1) describes a transimpedance amplifier which converts a current signal from a photo diode to a voltage signal and amplifies the signal in a high speed optical receiver. Particularly, a regulated cascode amplifier circuit is optimal as a transimpedance amplifier for which high-speed operation of several Gbps or higher is required.

SUMMARY OF THE INVENTION

Recently, as the speed of communication has been increased, the communication speed has undergone transition from 10 Gbps to, for example, 25 Gbps or 40 Gbps. Along with such increase in the speed of communication, application of optical communication devices supporting optical fiber cables as, for example, router devices or server devices has been developing. The optical communication devices are normally assumed to be used for long-distance transmission of the order of kilometers between devices, and it is important to ensure high-speed and reliability in accordance with the transmission distance.

Such optical communication devices include many devices that have a comparatively large size (for example, the order of several tens of centimeters or the order of meters), and communication using electrical signals is normally carried out in the devices. More specifically, the optical communication apparatus, for example, converts an optical signal, which has been input from outside, to an electrical signal, carries out predetermined processing while carrying out short reach transmission (for example, the order of meters) in the apparatus with the electrical signal, converts the electrical signal again to an optical signal, and outputs the optical signal to outside.

In the short reach transmission, for example, communication by electrical signals using copper cables or the like is carried out, wherein transmission waveform quality is significantly deteriorated in the copper cables as the speed of communication is increased. Therefore, application of optical communication to the short reach transmission in such an apparatus has been required. In this case, in optical communication, all the internal signal processings of the router device or the like are carried out by electrical signals; therefore, optical signals have to be converted to electrical signals by an optical element. Therefore, it is desired to suppress the electric power consumed at this part to a small level.

Problems to be solved by the present invention will be explained by taking FIGS. 1 and 2, which are applied to embodiments of the present invention, as an example. FIG. 1 is an explanatory diagram showing an example of a schematic configuration of the interior of a router device, and FIG. 2 is a block diagram showing an example of a schematic configuration of an optical module for carrying out inter-card communication in the router device.

In the configuration of the interior of the router device shown in FIG. 1, optical communication is carried out with optical modules OMODi and OMDs, optical connectors CNi and CNs, and optical lines OF between logic devices LSI_LGi mounted on interface cards IFC [1], IFC [2], . . . and a logic device LSI_LGs mounted on a switch card SWC.

The optical module OMD (OMDi, OMDs) shown in FIG. 2 is composed of: an optical element block OBK, which is composed of a laser diode LD and a photo diode PD; an analog front-end block AFE, which is composed of a laser diode driver LDD and a transimpedance amplifier TIA; and a speed converter circuit SDC, which is an electrical interface with the logic devices LSI (LSI_LGi, LSI_LGs). In a transmitting operation, when the laser diode driver LDD, which has received an electrical signal from the speed converter circuit SDC, drives the laser diode LD with the electrical signal, an optical signal is output from the laser diode LID to an optical line OFtx for transmission. On the other hand, in a receiving operation, an optical signal from an optical line OFrx for reception is converted to a current signal by the photo diode PD, and, furthermore, the current signal is converted to a voltage signal by the transimpedance amplifier TIA and transmitted to the speed converter circuit SDC.

In order to suppress the electric power consumed in a series of optical communication operations, it is important to suppress the energy of transmitted/received optical signals to a small level and to suppress the electric power consumed in the optical element block OBK and the analog front-end block AFE. Suppressing the energy of the transmitted/received optical signals and the electric power consumed by the laser diode LD to a small level particularly leads to suppressing the energy of the optical signals received by the photo diode PD and reducing the input current signal of the transimpedance amplifier TIA. Generally, the input current signal of the transimpedance amplifier TIA is a minute current of about hundreds of $\mu A$. Therefore, the gain of the transimpedance amplifier TIA is required to be about 1 K$\Omega$ in order to ensure hundreds of mV required for operating the speed converter circuit SDC of a subsequent stage as an output voltage signal.

FIG. 10 is a circuit diagram showing an example of the circuit configuration of a general and conventional transimpedance amplifier TIA and a pre-amplifier constituting the transimpedance amplifier TIA. The transimpedance amplifier TIA shown in FIG. 10 is composed of: the pre-amplifier PRAMP, which converts a single-end current signal from a photo diode PD to a voltage signal; an automatic decision threshold control ATC, which detects the center level (threshold voltage) of a signal according to an output signal of the pre-amplifier PRAMP; and a post-amplifier PSAMP, which differentiates and amplifies a single-end output signal of the pre-amplifier PRAMP. Particularly, the pre-amplifier PRAMP is easily affected by voltage variations of a power supply VDD since the pre-amplifier is a circuit to which a single-end current signal is input and which outputs a single-end current signal. Furthermore, in this circuit, the rate of the influence exerted on an output signal by voltage variations of the power supply VDD is large since the input current from the photo diode PD is several hundreds of μA, which is a minute current, as described above. Therefore, in the pre-amplifier PRAMP, high-quality current/voltage signal converting operations are disturbed by the voltage variation of the power supply VDD.

Next, the influence exerted on the output signal by the voltage variations of the power supply VDD will be explained with the pre-amplifier PRAMP shown in FIG. 10 corresponding to above-described Non-Patent Document 1 using a field effect transistor (hereinafter, abbreviated as MOS transistor) particularly effective for speed-up and electric-power reduction. In the pre-amplifier PRAMP, when a received current Iin from the photo diode PD is received, the current which flows to a MOS transistor M1 and a load resistance RL1 is reduced by the amount corresponding to the received current Iin, the electric potential of a node V1 undergoes an electric-potential change of the product of the resistance value of the load resistance RL1 and the current value of the received current Iin, and this electric-potential change is output to an output node Vo by a source follower circuit, which is composed of a MOS transistor M3 and a constant current source IS2; as a result, current/voltage conversion is carried out. Meanwhile, in this circuit, a voltage variation ΔVdd of the power supply VDD is transmitted to the output node Vo via the load resistance RL1 and the source follower circuit with almost no attenuation. At this point, the current which flows to the MOS transistor M2 is increased since the input voltage Vin is increased by the received current Iin. As a result, a current change by the difference of the currents which flow to the MOS transistors M1 and M2 is generated at the power supply VDD.

When the mutual conductances of the MOS transistors M1 and M2 are assumed to be gm1 and gm2, respectively, the current change ΔIdd which flows to the power supply VDD is:

$$\Delta Idd = Iin \times [1 - gm2/gm1/(1 + gm2 \times RL2)],$$

where, $1 < gm1 \times RL2$.

Therefore, $\Delta Idd \approx Iin$ is satisfied.

Meanwhile, in order to increase the band of the circuit, the load resistance RL1 has to be reduced since an operating band is inversely proportional to the load resistance RL1. For example, in order to cause the operating band to be several GHz or higher, the load resistance RL1 has to be about several hundreds of Ω; and, in order to further increase the band, the load resistance has to be reduced to several tens of Ω.

The amplitude of the output signal Vo of the pre-amplifier PRAMP is about several tens of mV since the received current Iin is about several hundreds of μA and the load resistance RL1 is several hundreds of Ω as described above. On the other hand, the voltage variation ΔVdd of the power supply VDD is the product of power-line impedance ZVdd of the power supply VDD and the above-described current change ΔIdd (=Iin). The frequency component of the received current signal in optical communication of several Gbps or higher is about several tens of MHz to several GHz. Particularly, in order to reduce the power-line impedance ZVdd having a band of several tens of MHz, a bypass capacitor Cbp is provided in the vicinity of the pre-amplifier PRAMP in the chip; however, due to restriction on the area which can be formed on semiconductor, the upper limit of the bypass capacitor Cbp in the vicinity of the pre-amplifier PRAMP in the chip is about 100 pF.

As a result, the voltage ΔVdd of the power supply VDD becomes several mV since the power-line impedance ZVdd of the band of several tens of MHz is several tens of Ω and the power supply current change ΔIdd is several hundreds of μA. Therefore, in the output of the pre-amplifier PRAMP, the rate of power supply noise with respect to the received signal exceeds several tens of % when noise of several mV is generated with respect to the received signal which is several tens of mV, and realization of high-quality and high-speed receiving operation of several Gbps or higher becomes difficult.

Therefore, the present invention has been made in view of the foregoing, and it is an object of the present invention to provide an optical module including a transimpedance amplifier which can realize high-speed and high-quality receiving operation. The above and other preferred aims and novel characteristics of the present invention will be apparent from the description of the present specification and the accompanying drawings.

The typical ones of the inventions disclosed in the present application will be briefly described as follows.

More specifically, a transimpedance amplifier according to a typical embodiment has: a pre-amplifier that employs a single-end current signal as an input and converts the single-end current signal to a single-end voltage signal; an automatic decision threshold control that detects a center electric potential of the single-end voltage signal serving as an output of the pre-amplifier; a post-amplifier that differentiates and amplifies the single-end voltage signal of the output of the pre-amplifier; and a power circuit that supplies power to the pre-amplifier. Particularly, in accordance with an input voltage signal or an output voltage signal of the pre-amplifier, the power circuit outputs a varied current that flows to a supply terminal of the pre-amplifier and a varied current having a phase opposite to that of the varied current. By virtue of this configuration, a function that cancels out the power supply current change is provided in the power circuit, the variation of the power supply current of the pre-amplifier generated in a receiving operation is cancelled out, and output noise caused by the power supply current variation can be reduced.

Also, a semiconductor device according to a typical embodiment has: a laser diode driver that drives a laser diode; a transimpedance amplifier that amplifies and converts a current signal from a photo diode to a voltage signal; and a speed converter circuit that converts the transmission speed of an input/output signal to/from the laser diode driver and the transimpedance amplifier and the transmission speed of an input/output signal to/from outside. The laser diode driver, the transimpedance amplifier, and the speed converter circuit are formed on a single semiconductor chip. Particularly, the transimpedance amplifier has a configuration as described above.

Moreover, an optical module according to a typical embodiment includes an optical element device and a semiconductor device. The optical element device and the semiconductor device are mounted on a single package. Furthermore, the optical element device has a photo diode and a laser diode. The photo diode and the laser diode are formed on the single semiconductor chip. The semiconductor device has a configuration as described above, and, particularly, the transimpedance amplifier has a configuration as described above.

From the invention disclosed by the present application, an optical module that reduces output noise caused by power supply current variation can be provided.

BRIEF DESCRIPTIONS OF THE DRAWINGS

FIGS. 6A and 6B is used;

Figure 9:
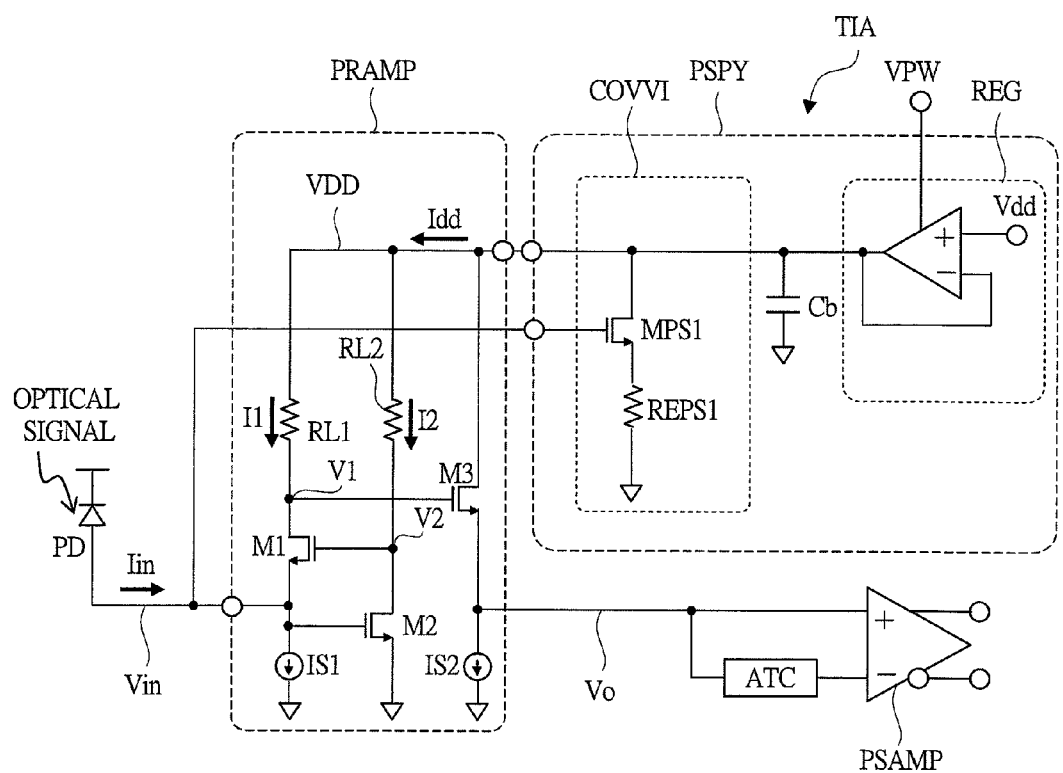
Figure 10:
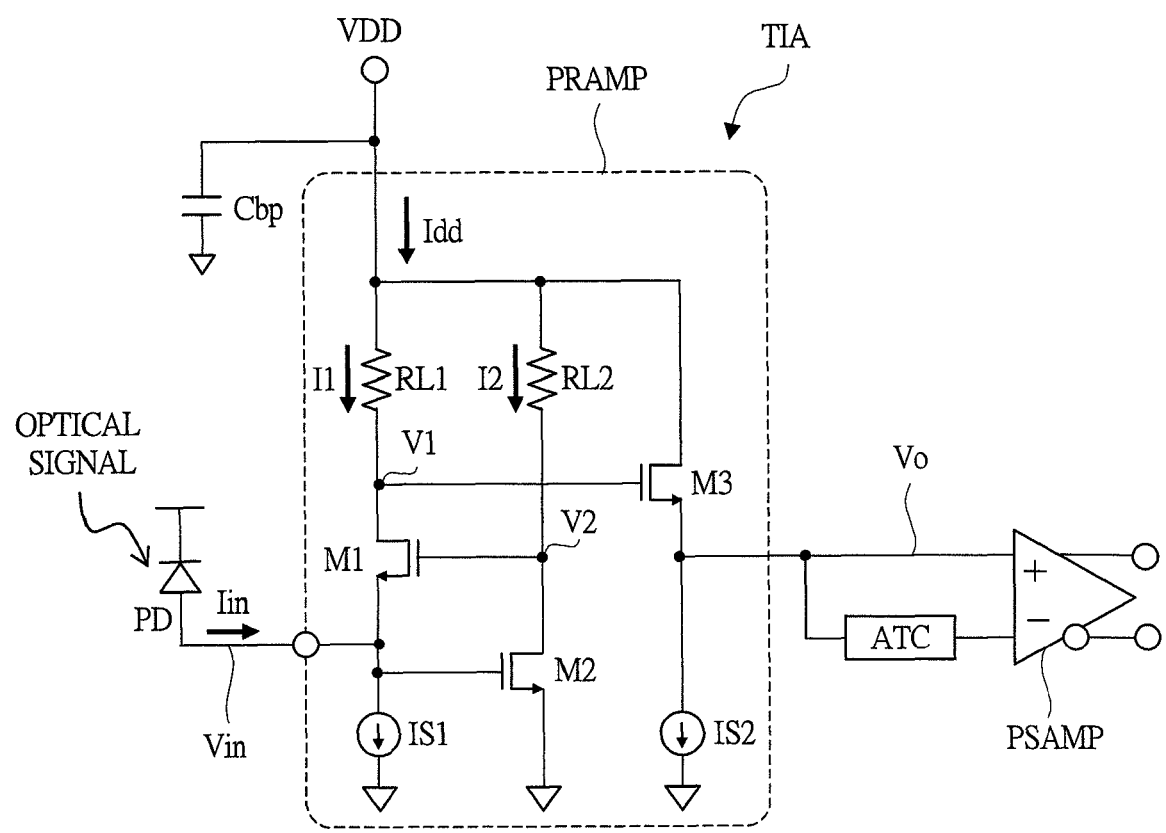

FIG. 9 is a circuit diagram showing an example of a circuit configuration of a pre-amplifier and a power circuit (still another specific example of the detect and cancel circuit of power supply current variation) constituting a transimpedance amplifier in a router device according to a fifth embodiment of the present invention; and FIG. 10 is a circuit diagram showing an example of a circuit configuration of a transimpedance amplifier and a pre-amplifier constituting a transimpedance amplifier according to a conventional router device.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Moreover, although it is not limited to this, circuit elements composing each function blocks of each of the embodiments are formed on a semiconductor substrate of, for example, single crystal silicon. Note that, while MOSFET (Metal Oxide Semiconductor Field Effect Transistor; abbreviated as MOS transistor) will be used as one example of MISFET (Metal Insulator Semiconductor Field Effect Transistor) in the embodiments, using a non-oxide film as a gate insulating film is not eliminated. Although connections to a substrate potential of MOS transistors are not particularly depicted in the drawings, the way of connection will not be specifically limited as long as the MOS transistors can be normally operated.

Hereinafter, embodiments of the present invention will be described in detail with reference to the accompanying drawings. Note that components having the same function are denoted by the same reference symbols in principle throughout the drawings for describing the embodiment, and the repetitive description thereof will be omitted.

Summary of Embodiments

A transimpedance amplifier (a transimpedance amplifier TIA, corresponding constituent elements, etc. will be additionally described in parentheses as examples) has: a pre-amplifier (preamplifier PRAMP) that uses a single-end current signal as an input and converts the single-end current signal to a single-end voltage signal; an automatic decision threshold control (automatic decision threshold control ATC) that detects a center electric potential of the single-end voltage signal serving as an output of the pre-amplifier; a post-amplifier (post-amplifier PSAMP) that differentiates and amplifies the single-end voltage signal of the output of the pre-amplifier; and a power circuit (power circuit PSPY) that supplies power to the pre-amplifier. Particularly, in accordance with an input voltage signal or an output voltage signal of the pre-amplifier, the power circuit outputs a varied current that flows to a supply terminal of the pre-amplifier and a varied current having a phase opposite to that of the varied current.

A semiconductor device according to the present embodiment includes: a laser diode driver (laser diode driver LDD) that drives a laser diode; a transimpedance amplifier (transimpedance amplifier TIA) that amplifies and converts a current signal from a photo diode to a voltage signal; and a speed converter circuit (speed converter circuit SDC) that converts the transmission speed of an input/output signal to/from the laser diode driver and the transimpedance amplifier and the transmission speed of an input/output signal to/from outside. The laser diode driver, the transimpedance amplifier, and the speed converter circuit are formed on a single semiconductor chip. Particularly, the transimpedance amplifier has a configuration as described above.

An optical module according to the present embodiment has an optical element device and a semiconductor device. The optical element device and the semiconductor device are mounted on a single package. Furthermore, the optical element device has a photo diode (photo diode PD) and a laser diode (laser diode LD); and the photo diode and the laser diode are formed on the single semiconductor chip. The semiconductor device has a configuration as described above, and, particularly, the transimpedance amplifier has a configuration as described above.

Embodiments based on the summary of the embodiments of the present invention described above will be described in detail below. The embodiments described below are examples using the present invention, and the present invention is not limited by the following embodiments. In the embodiments, terminal names of voltages and signals and the names of voltages and signals corresponding to the terminal names may be denoted by the same symbols.

First Embodiment

A first embodiment of the present invention will be described with reference to FIGS. 1 to 4.

<Router Device>

Figure 1:
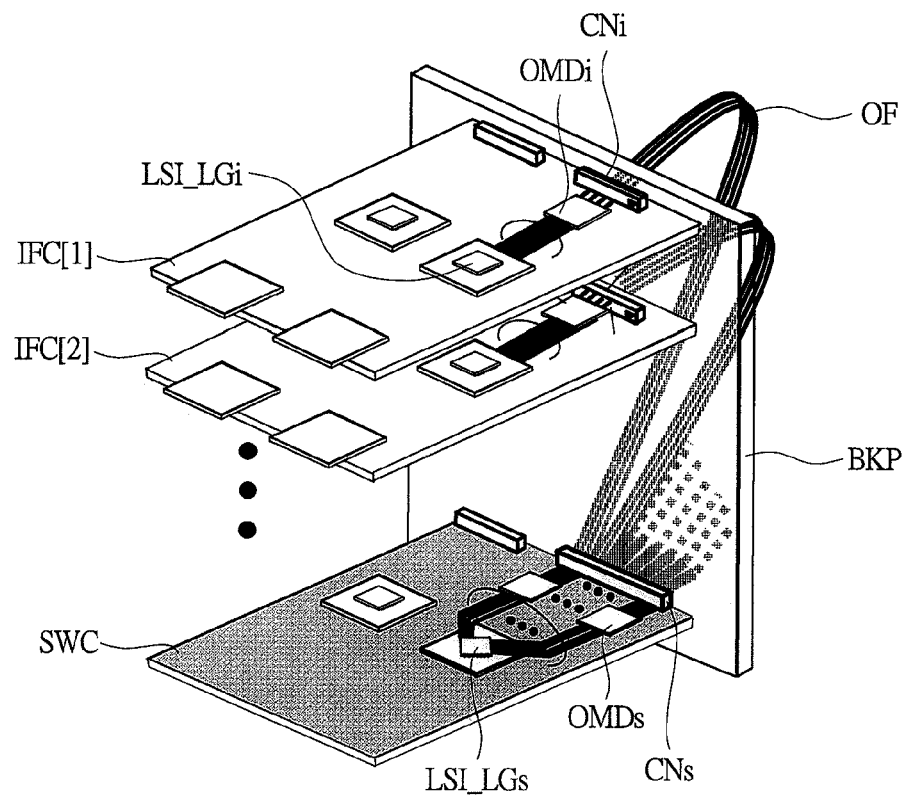
FIG. 1 is an explanatory diagram showing an example of a schematic configuration of an interior of a router device according to a first embodiment of the present invention.

FIG. 1 is an explanatory diagram showing an example of a schematic configuration of the interior of a router device according to the first embodiment.

The router device according to the first embodiment is composed of, for example, a chassis which has, for example, a width and depth of several tens of cm and a height of 1 to 2 m. Many communication connectors are provided on the surface of the chassis, and the connectors are, for example, cable terminals of Ethernet (registered trade name) or optical fiber cable terminals.

As shown in FIG. 1, in the router device, for example, a plurality of interface cards IFC (IFC [1], IFC [2], . . . ) and a switch card SWC are provided. The cards are respectively connected to card connectors provided on a part called, for example, backplane BKP. The card connectors include connectors for supply power from the backplane BKP to the cards and optical connectors (optical fiber connectors) CNi and CNs for carrying out communication between the cards via optical lines (typically, optical fiber cables) OF. The interface cards IFC are connected to the switch card SWC via the optical connectors CNi, the optical lines OF, and the optical connectors CNs so that communications via the switch card SWC can be carried out among the interface cards IFC, respectively.

On each of the interface cards IFC, a logic device LSI_LGi, which carries out predetermined protocol processing required in an upper hierarchical level of communication, and an optical module OMDi, which converts electrical signals serving as inputs/outputs of the logical device LSI_LGi to optical signals and carries out input/output to/from the optical lines OF via the optical connector CNi, are mounted. Similarly, also on the switch card SWC, a logic device LSI_LGs, which carries out predetermined protocol processing, and an optical module OMDs, which converts electrical signals serving as inputs/outputs of the logic device LSI_LGs to optical signals and carries out input/output to/from the optical lines OF via the optical connector CNs, are mounted.

In an optical communication apparatus like such a router device or the like, the length of each optical line OF sometimes reaches, for example, several meters. In that case, if a copper cable or the like is used instead of the optical line OF, communication of, for example, several tens of Gbps level may not be supported due to transmission loss. Therefore, using an optical module of the present embodiment described in detail below is beneficial.

<Optical Module>

Figure 2:
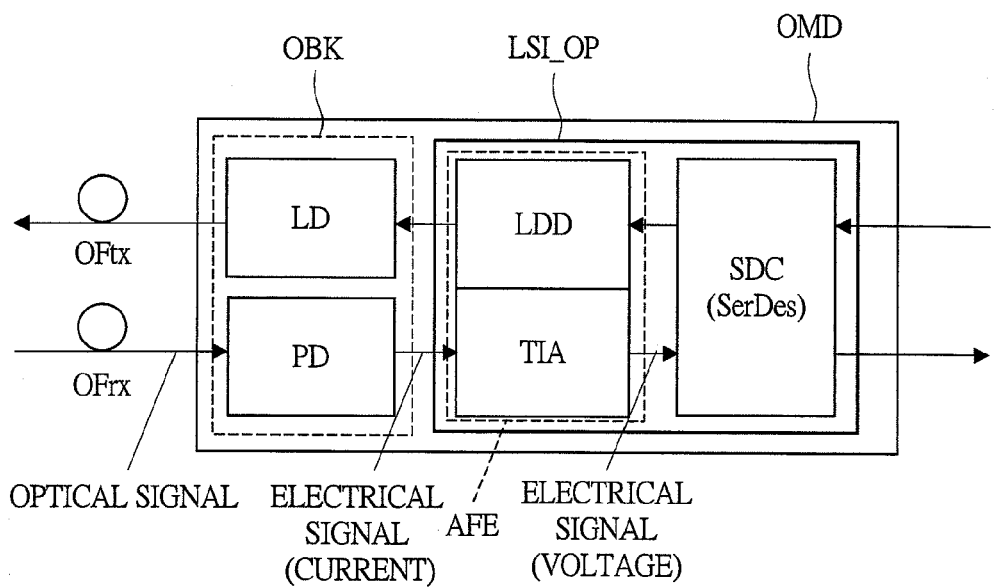
FIG. 2 is a block diagram showing an example of the schematic configuration of an optical module for carrying out inter-card communication in the router device of FIG. 1.

FIG. 2 is a block diagram showing an example of a schematic configuration of an optical module OMD for carrying out inter-card communication in the above-described router device in FIG. 1.

The optical module OMD according to the present embodiment is provided with an optical element block OBK, an analog front-end block AFE, and a speed converter circuit SDC.

The optical element block OBK is provided with a laser diode LD, which carries out output to an optical line OFtx for transmission, and a photo diode PD, which converts optical signals, which have been input from an optical line OFrx for reception, to electrical signals (current signals). The laser diode LD and the photo diode PD are composed of, for example, individual semiconductor chips, respectively; and, in practice, each of the laser diode LD and the photo diode PD is present as a plurality of semiconductor chips or semiconductor chips integrated in an array depending on the number of communication channels.

The analog front-end block AFE is provided with a laser diode driver LDD, which drives the laser diode LD, and a transimpedance amplifier TIA, which amplifies and converts the current signals from the photo diode PD to voltage signals. Herein, an example in which the analog front-end block AFE is formed on a single semiconductor chip LSI_OP is shown; however, the laser diode driver LDD and the transimpedance amplifier TIA may be individually formed to be on different chips.

The speed converter circuit SDC is called, for example, SerDes (Serializer/Deserializer) and converts the transmission speeds of the signals input/output to/from the analog front-end block AFE (the laser diode driver LDD and the transimpedance amplifier TIA) and the transmission speeds of the signals input/output to/from outside of the optical module OMD (i.e., the logic device LSI_LG).

In the optical module OMD formed in the above-described manner, in a transmitting operation, when the laser diode driver LDD, which has received an electrical signal from the speed converter circuit SDC, drives the laser diode LD with a current signal, an optical signal from the laser diode LD is output to the optical line OFtx for transmission. On the other hand, in a receiving operation, an optical signal from the optical line OFrx for reception is converted to a current signal in the photo diode PD, and the current signal is further converted to a voltage signal in the transimpedance amplifier TIA and transmitted to the speed converter circuit SDC.

For example, electrical signals of 10 Gbps×10 (10 channels) are transmitted/received between the logic device LSI_LG and optical module OMD of FIG. 1, and the speed converter circuit SDC converts the electrical signals to 25 Gbps×4 (4 channels) to carry out transmission/reception with the analog front-end block AFE. In this case, the communication via the optical lines OF between the cards (the interface cards IFC, the switch card SWC) of FIG. 1 is also carried out by the optical elements of 25 Gbps×4 channels.

In the example of FIG. 2, in order to reduce power consumption by reducing the electrical I/O between the analog front-end block AFE and the speed converter circuit SDC, the analog front-end block AFE and the speed converter circuit SDC are formed in a single semiconductor process of, for example, CMOS to integrally form them on the semiconductor chip LSI_OP (shown in later-described FIG. 3). However, the analog front-end block AFE and the speed converter SDC may be mounted as mutually different semiconductor chips.

<Structure of Optical Module>

Figure 3:
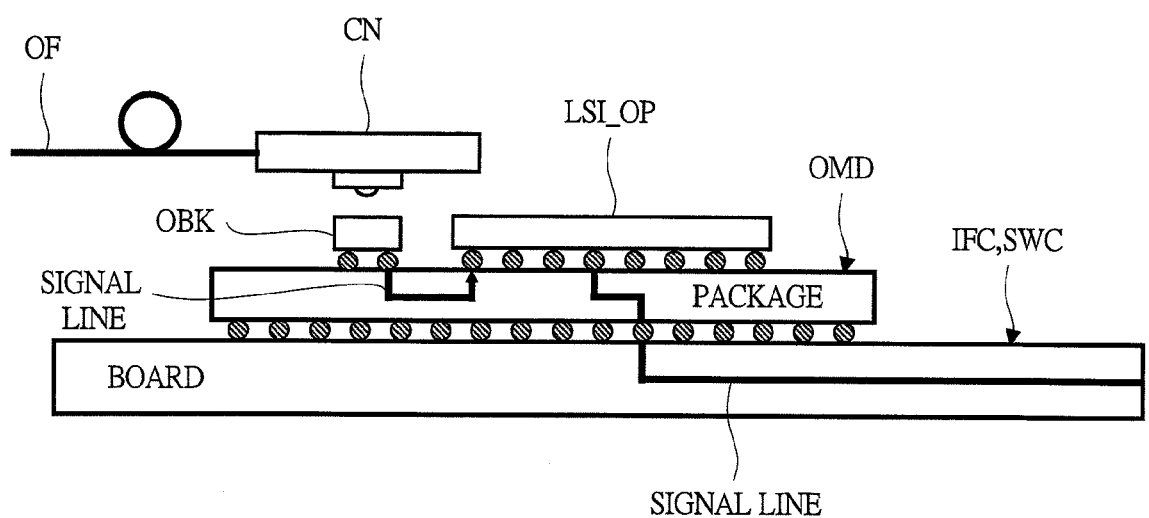
FIG. 3 is a cross-sectional view showing an example of the schematic structure of the optical module of FIG. 2.

FIG. 3 is a cross-sectional view (cross sectional presentation is omitted to facilitate viewability) showing an example of the schematic structure of the above-described optical module OMD of FIG. 2.

The structure of the optical module OMD in the present embodiment is composed of: an optical element device on which the optical element block OBK is integrated; a semiconductor device of the semiconductor chip LSI_OP on which the analog front-end block AFE and the speed converter circuit SDC are integrated; a package on which the optical element device and the semiconductor device are mounted. The optical element device and the semiconductor device are mounted on a package via bumps. At a position opposed to the optical element device, the optical connector CN to which the optical line OF such as an optical fiber cable is connected is disposed. The optical module OMD in which the optical element device and the semiconductor device are mounted on the package has a structure that the module is further mounted on a board such as the interface card IFC or the switch card SWC.

The optical element device has the photo diode PD and the laser diode LD described above and shown in FIG. 2, and these are formed on a single semiconductor chip. As shown in above-described FIG. 2, the semiconductor device has: the laser diode driver LDD, which drives the laser diode LD; the transimpedance amplifier TIA, which amplifies and converts the current signals from the photo diode PD to voltage signals; and a speed converter circuit SDC, which converts the transmission speed of the signals input/output to/from the laser diode driver LDD and the transimpedance amplifier TIA and the transmission speed of the signals input/output to/from outside. These are formed on the single semiconductor chip.

In the optical module OMD of the present embodiment having the structure as described above, the analog front-end block AFE and the speed converter circuit SDC can be formed as the integrated semiconductor chip LSI_OP by the single semiconductor process of, for example, CMOS. Conventionally, the part of the speed converter circuit SDC has been formed by a device of a CMOS process, while the part of the analog front-end block AFE has been formed by a high-speed device of, for example, SiGe or InP; therefore, these two devices have been configured to be mounted on the board. In this configuration, signal lines on the board mutually connecting the two devices have used high-speed signals of, for example, 25 Gbps or higher compared with signal lines of low-speed signals (for example, 10 Gbps or lower) from the device of the part of the speed converter circuit SDC to outside. Therefore, the power consumption of the electrical I/O part has been large, and improvement therefor has been desired. With respect to this demand, in the present embodiment, the electrical I/O of the high-speed signals can be reduced, and power reduction can be realized since the integrated semiconductor device can be formed as the semiconductor chip LSIOP as shown in FIG. 3 by a CMOS process.

<Transimpedance Amplifier>

Figure 4A:
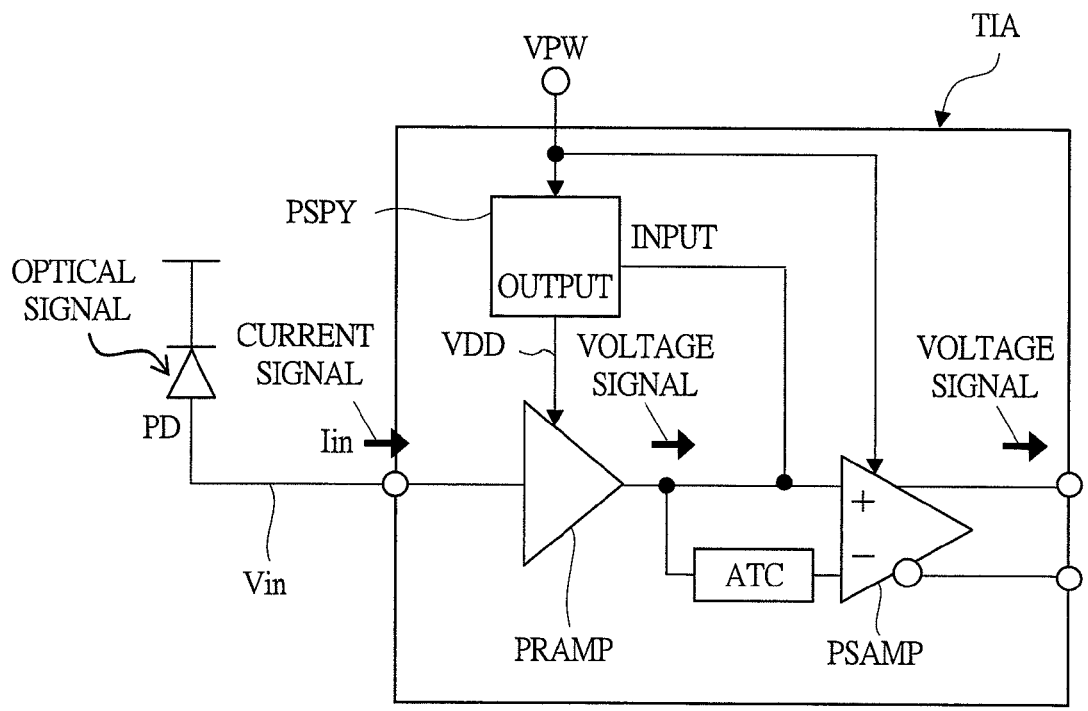
FIG. 4A is a block diagram showing an example of a configuration of a transimpedance amplifier, which is one of parts constituting a reception system in the optical module of FIG. 2.
Figure 4B:
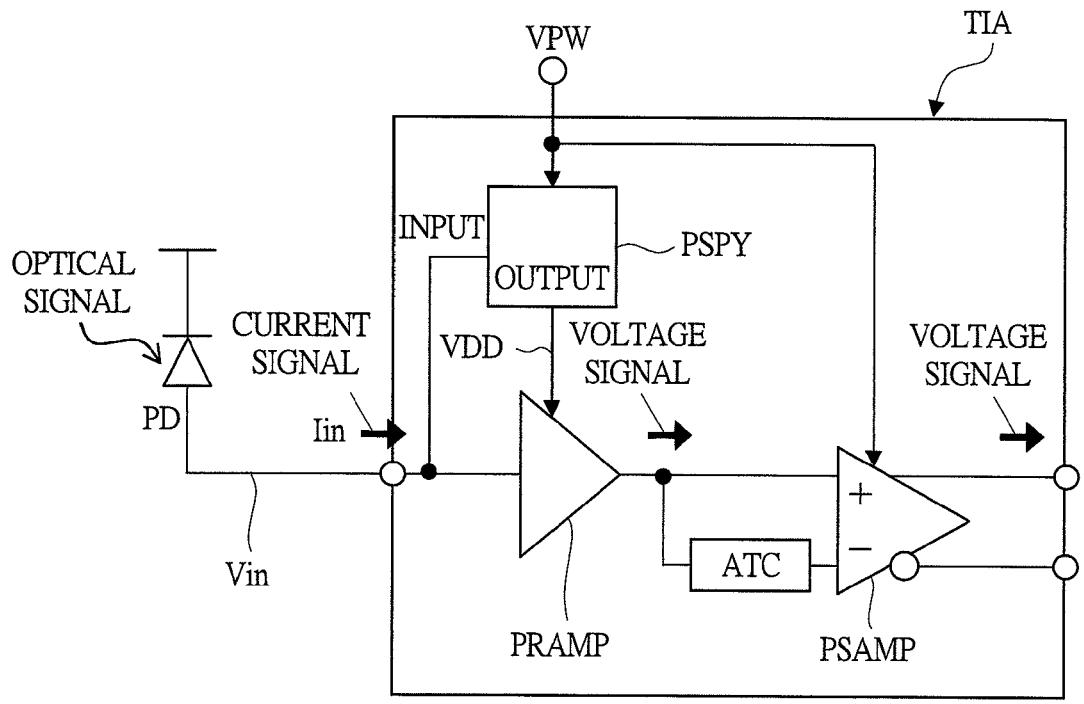
FIG. 4B is a block diagram showing an example of a configuration of a transimpedance amplifier, which is one of parts constituting a reception system in the optical module of FIG. 2.

FIGS. 4A and 4B are block diagrams showing examples of the configuration of the transimpedance amplifier TIA, which is one of the parts constituting a reception system in the optical module OMD of above-described FIG. 2. FIG. 4A shows a block configuration in which a current variation ΔIdd of a pre-amplifier PRAMP is detected by an output voltage of the pre-amplifier PRAMP, and FIG. 4B shows a block configuration in which the current variation ΔIdd of the pre-amplifier PRAMP is detected by an input voltage of the pre-amplifier PRAMP.

First, the configuration of the transimpedance amplifier TIA shown in FIG. 4A will be explained. The transimpedance amplifier TIA shown in FIG. 4A is composed of: the pre-amplifier PRAMP, which converts a single-end current signal from the photo diode PD to a voltage signal; an automatic decision threshold control ATC, which detects a center level (threshold voltage) of a signal from the single-end output voltage signal of the pre-amplifier PRAMP; a post-amplifier PSAMP, which differentiate and amplifies the single-end output voltage signal of the pre-amplifier PRAMP; and a power circuit PSPY, which supplies power supply VDD to the pre-amplifier PRAMP.

The power circuit PSPY uses the output voltage signal of the pre-amplifier PRAMP as an input; detects, from the output voltage signal of the pre-amplifier PRAMP, the varied current ΔIdd flowing to a supply terminal VDD of the pre-amplifier PRAMP; and outputs a varied current having an opposite phase of the varied current ΔIdd to the pre-amplifier PRAMP. When this configuration is used, the variation ΔIdd of the power supply current of the pre-amplifier PRAMP generated in a receiving operation can be cancelled out, and output noise caused by this power supply current variation can be reduced.

Next, the configuration of the transimpedance amplifier TIA shown in FIG. 4B will be described. As well as the transimpedance amplifier TIA shown in FIG. 4A, the transimpedance amplifier TIA shown in FIG. 4B is composed of the pre-amplifier PRAMP, the automatic decision threshold control ATC, the post-amplifier PSAMP, and the power circuit PSPY; and a point different from FIG. 4A is that the power circuit PSPY employs an input voltage signal of the pre-amplifier PRAMP as an input. Also in the configuration of the transimpedance amplifier TIA shown in FIG. 4B, the varied current of the pre-amplifier PRAMP is proportional to a received current; therefore, even when the input voltage is used, the power supply current variation can be detected. Therefore, the configuration of the transimpedance amplifier TIA shown in FIG. 4B is also similar to the configuration of that of FIG. 4A except for the function of detecting the power supply current change; therefore, the output noise caused by the power supply current variation can be reduced as well as the configuration in FIG. 4A.

Effects of the First Embodiment

As described above, according to the first embodiment, in the transimpedance amplifier TIA composed of the pre-amplifier PRAMP, the automatic decision threshold control ATC, the post-amplifier PSAMP, and the power circuit PSPY, the power circuit PSPY detects, from the output voltage or the input voltage of the pre-amplifier PRAMP, the varied current ΔIdd flowing to the supply terminal VDD of the pre-amplifier PRAMP and outputs the varied current having the opposite phase of the varied current ΔIdd to the pre-amplifier PRAMP, thereby cancelling out the variation in the power supply current of the pre-amplifier PRAMP generated in a receiving operation, wherein the output noise caused by the power supply current variation can be reduced. As a result, a high-speed and high-quality receiving operation can be realized by using the optical module OMD, which includes the transimpedance amplifier TIA, and a router device.

Furthermore, since the analog front-end block AFE, which includes the transimpedance amplifier TIA, and the speed converter circuit SDC can be formed as the integrated semiconductor chip LSI_OP by the CMOS process, the electrical I/O of high-speed signals can be reduced, and power reduction can be realized.

Second Embodiment

A second embodiment of the present invention will be described with reference to FIGS. 5A and 5B. The second embodiment is an example showing, in detail, the circuit configuration of the pre-amplifier PRAMP and the power circuit PSPY constituting the transimpedance amplifier TIA of the above-described first embodiment.

In the second embodiment, the power circuit PSPY is characterized by having: a regulator (regulator REG), which supplies a power-supply voltage to the pre-amplifier PRAMP; a current adding circuit (a detect and cancel circuit of power supply current variation COVVI), which detects a varied current flowing to the supply terminal of the pre-amplifier PRAMP while using the input voltage signal or the output voltage signal of the pre-amplifier PRAMP as an input and adds the varied current having the opposite phase of the varied current to the output of the regulator; and a bypass capacity (bypass capacitor Cb), which is provided at an output of the regulator.

<Transimpedance Amplifier>

Figure 5A:
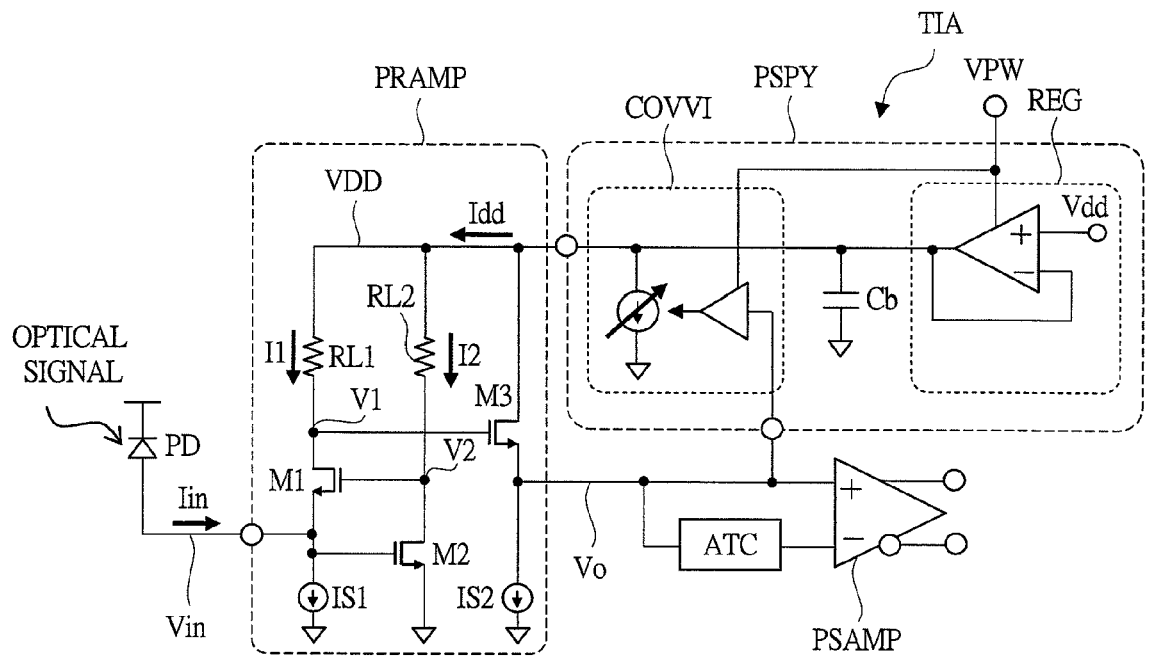
FIG. 5A is a circuit diagram showing an example of a circuit configuration of a pre-amplifier and a power circuit constituting the transimpedance amplifier in a router device according to a second embodiment of the present invention.
Figure 5B:
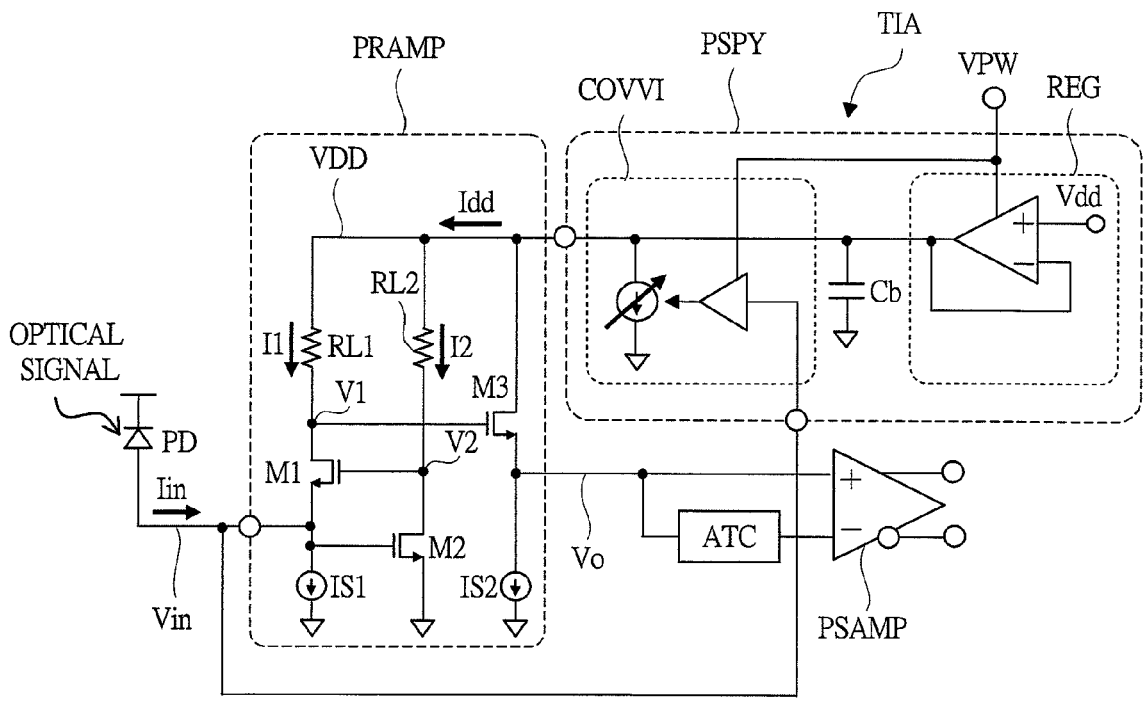
FIG. 5B is a circuit diagram showing an example of a circuit configuration of a pre-amplifier and a power circuit constituting the transimpedance amplifier in the router device according to the second embodiment of the present invention.

FIGS. 5A and 5B are circuit diagrams showing examples of the circuit configuration of the pre-amplifier PRAMP and the power circuit PSPY constituting the transimpedance amplifier TIA in a router device in the second embodiment. FIGS. 5A and 5B show the examples in which the power circuit PSPY is composed of: the bypass capacitor Cb, which suppresses voltage variations of the power supply VDD; the detect and cancel circuit of power supply current variation COVVI, which detects the power supply current variation of the pre-amplifier PRAMP and cancels out the power supply current variation of the pre-amplifier PRAMP by a varied current having an opposite phase of the varied current; and the regulator REG, which supplies power of the pre-amplifier PRAMP in the transimpedance amplifier TIA shown in above-described FIGS. 4A and 4B. The power of the transimpedance amplifier TIA is applied from supply terminal VPW.

As well as the pre-amplifier shown in above-described FIG. 10, the pre-amplifier PRAMP is composed of MOS transistors M1, M2, and M3, constant current sources IS1 and IS2, and load resistances RL1 and RL2, and the power supply VDD is applied from the power circuit PSPY.

In the transimpedance amplifiers TIA shown in FIGS. 5A and 5B, FIG. 5A shows a circuit configuration in which the current variation ΔIdd of the pre-amplifier PRAMP is detected by the output voltage of the pre-amplifier PRAMP, and FIG. 5B shows a circuit configuration in which the current variation ΔIdd of the pre-amplifier PRAMP is detected by the input voltage of the pre-amplifier PRAMP.

First, the circuit configuration shown in FIG. 5A will be explained. The regulator REG can be composed of an operational amplifier as shown in FIG. 5A. As the output of the operational amplifier, a positive-electrode-side input electric potential is output when an output electric potential is fed back to a negative-electrode-side input. Therefore, the power-supply voltage Vdd of the pre-amplifier PRAMP should be applied to a positive-electrode-side input terminal. Meanwhile, the power supply current variation caused by the receiving operation of the pre-amplifier PRAMP is proportional to the received current signal as described above. Furthermore, the output voltage of the pre-amplifier PRAMP is also proportional to the received current. Therefore, the detect and cancel circuit of power supply current variation COVVI can cancel out the varied current which flows to the output of the regulator REG by causing a current having the opposite phase of the received current proportional to the output voltage Vo of the pre-amplifier PRAMP to flow. As a result, the voltage variation of the power supply VDD of the pre-amplifier PRAMP can be suppressed to a small level. In addition, the power-supply voltage variation can be further suppressed to a small level by absorbing the power supply current variation by the bypass capacitor Cb provided at the output of the regulator REG.

Next, the circuit configuration shown in FIG. 5B will be described. As well as FIG. 5A, in the circuit configuration shown in FIG. 5B, the regulator REG is composed of an operational amplifier, and the bypass capacitor Cb is configured to be provided at the output of the regulator REG; and a point different from FIG. 5A is that the detect and cancel circuit of power supply current variation COVVI uses the input voltage of the pre-amplifier PRAMP as an input. Also in the circuit configuration shown in FIG. 5B, the current variation of the pre-amplifier PRAMP is proportional to the received current; therefore, the power supply current variation can be detected even by using the input voltage. Therefore, the voltage variation of the power supply VDD of the pre-amplifier PRAMP can be suppressed to a small level as well as FIG. 5A since this circuit configuration also has a similar configuration as FIG. 5A except for the function of detecting the power supply current change. In addition, the power-supply voltage variation can be further suppressed to a small level by absorbing the power supply current variation by the bypass capacitor Cb provided at the output of the regulator REG.

Effects of the Second Embodiment

As described above, according to the second embodiment, the power circuit PSPY constituting the transimpedance amplifier TIA is composed of the regulator REG, the detect and cancel circuit of power supply current variation COVVI, and the bypass capacitor Circuit board. As a result, effects similar to those of the above-described first embodiment can be obtained, the voltage variation of the power supply VDD of the pre-amplifier PRAMP can be particularly suppressed to a small level, and the power-supply voltage variation can be further suppressed to a small level by absorbing the power supply current variation by the bypass capacitor Cb.

Third Embodiment

A third embodiment of the present invention will be described with reference to FIGS. 6A and 6B and FIG. 7. The third embodiment is an example showing, in detail, a circuit configuration of the detect and cancel circuit of power supply current variation COVVI constituting the power circuit PSPY of the above-described second embodiment.

In the third embodiment, the current adding circuit (the detect and cancel circuit of power supply current variation COVVI) is characterized by having a constant current source (constant current source ISC1), which can be adjusted to an optional current value, and a current switch circuit (MOS transistors MCS1 and MCS2). One of terminals of the current switch circuit is connected to the output of the regulator REG, the other terminal is connected to a first supply terminal, the current of the constant current source is added to the output current of the regulator REG via the current switch circuit so that the added current has the opposite phase of the varied current flowing to the supply terminal of the pre-amplifier PRAMP depending on the state of the input voltage signal or the output voltage signal of the pre-amplifier PRAMP.

Specifically, the current switch circuit is characterized by having a first field effect transistor (MOS transistor MCS1) and a second field effect transistor (MOS transistor MCS2) which respectively have source terminals connected to each other and are connected to the constant current source. The drain of the first field effect transistor is connected to the output of the regulator REG, the drain of the second field effect transistor is connected to the first supply terminal, and the gate of the first field effect transistor is connected to the output having the same phase as the input electric-potential variation of the pre-amplifier PRAMP.

Furthermore, the circuit is characterized in that the gate of the second field effect transistor is connected to the output of the pre-amplifier PRAMP via a low pass filter (a resistance Rlp and a capacitor Clp).

<Transimpedance Amplifier>

Figure 6A:
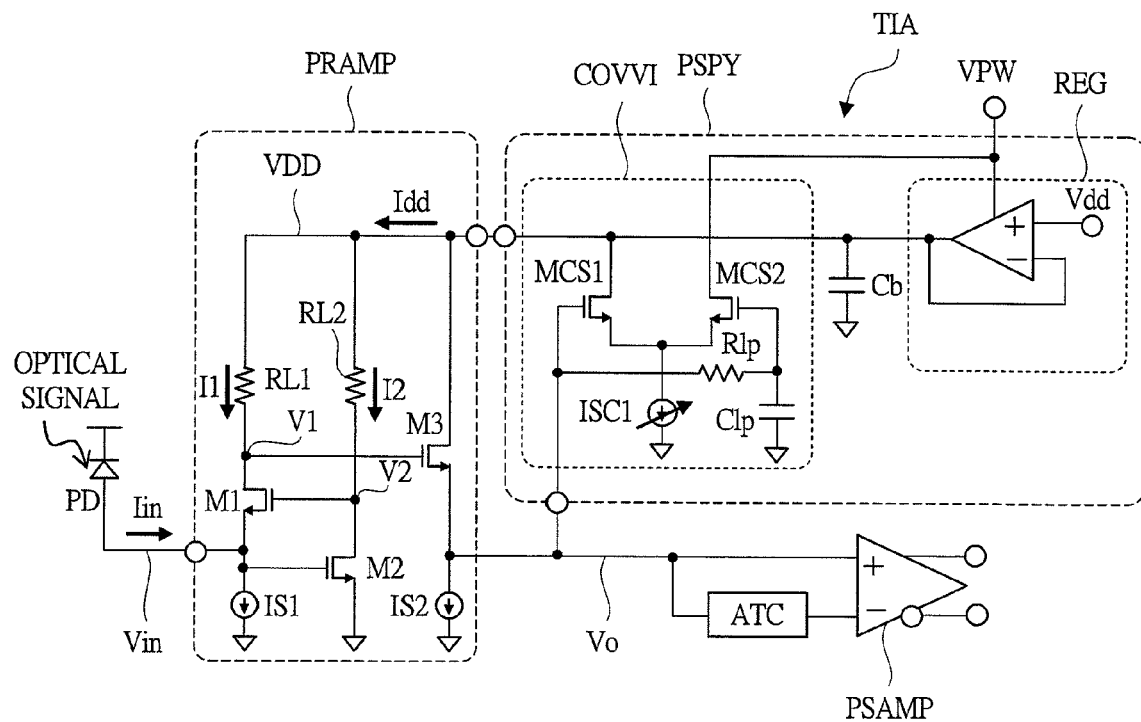
FIG. 6A is a circuit diagram showing an example of the circuit configuration of the pre-amplifier and the power circuit (specific example of a detect and cancel circuit of power supply current variation) constituting the transimpedance amplifier in a router device in a third embodiment of the present invention.
Figure 6B:
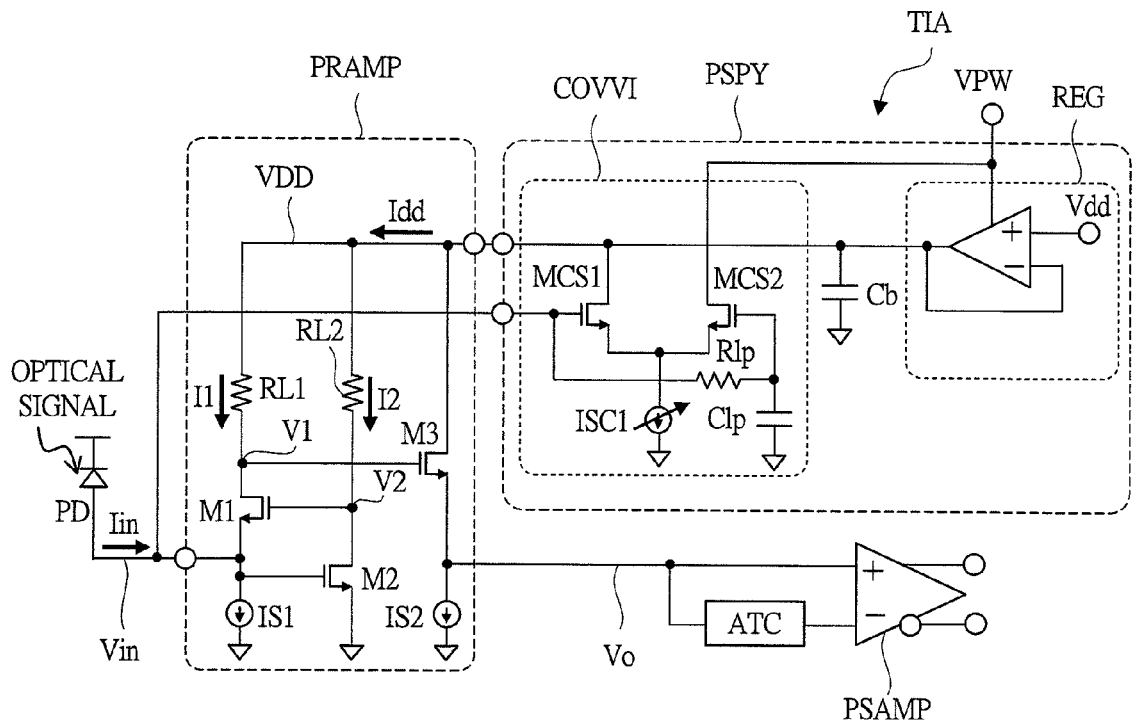
FIG. 6B is a circuit diagram showing an example of the circuit configuration of the pre-amplifier and the power circuit (specific example of a detect and cancel circuit of power supply current variation) constituting the transimpedance amplifier in the router device according to a third embodiment of the present invention.

FIGS. 6A and 6B are circuit diagrams showing examples of the circuit configuration of the pre-amplifier PRAMP and the power circuit PSPY (specific example of the detect and cancel circuit of power supply current variation COVVI) constituting the transimpedance amplifier TIA in a router device in the third embodiment. FIGS. 6A and 6B show the examples in which the detect and cancel circuit of power supply current variation COVVI is composed of a differential circuit in the transimpedance amplifier TIA shown in FIGS. 5A and 5B.

FIG. 6A shows a circuit configuration in which the current variation ΔIdd of the pre-amplifier PRAMP is detected by the output voltage of the pre-amplifier PRAMP, and FIG. 6B shows a circuit configuration in which the current variation ΔIdd of the pre-amplifier PRAMP is detected by the input voltage of the pre-amplifier PRAMP.

First, the circuit configuration shown in FIG. GA will be described. The detect and cancel circuit COVVI of the power supply current variation is composed of the MOS transistors MCS1 and MCS2 constituting the current switch circuit, the constant current source ISC1, and the resistance Rlp and the capacitor Clp constituting the low pass filter. In the detect and cancel circuit of power supply current variation COVVI, the drain of the MOS transistor MCS1 is connected to the output of the regulator REG, the drain of the MOS transistor MCS2 is connected to the supply terminal VPW, and the sources of the MOS transistors MCS1 and MCS2 are commonly connected to the constant current source ISC1 and grounded. The gate of the MOS transistor MCS1 is connected to the output of the pre-amplifier PRAMP, and the gate of the MOS transistor MCS2 is grounded through the capacitor Clp. The resistance Rlp is connected between the gate of the MOS transistor MCS1 and the gate of the MOS transistor MCS2.

In such a circuit configuration, the low pass filter detects the center voltage of the output voltage of the pre-amplifier PRAMP. Therefore, in the detect and cancel circuit of power supply current variation COVVI, if the output voltage of the pre-amplifier PRAMP is higher than the center voltage detected by the low pass filter, in other words, if a high level is output, the current of the constant current source ISC1 flows out from the output of the regulator REG via the MOS transistor MCS1. Therefore, when the received current flows to the input of the pre-amplifier PRAMP, the power supply current is reduced by an amount corresponding to the received current Iin and the output voltage thereof is increased to a high level at the same time in the pre-amplifier PRAMP. As a result, at this point, the power supply current of the pre-amplifier PRAMP is reduced, and the output current of the detect and cancel circuit of power supply current variation COVVI is increased at the same time; therefore, when the received current Iin and the current of the constant current source ISC1 are adjusted to be mutually the same, the current changes are mutually cancelled out, and the output current of the regulator REG is changed little.

Next, the circuit configuration shown in FIG. 6B will be explained. As well as FIG. 6A, in the circuit configuration shown in FIG. 6B, the detect and cancel circuit of power supply current variation COVVI is composed of the MOS transistors MCS1 and MCS2, the constant current source ISC1, the resistance Rlp, and the capacitor Clp; and a point different from FIG. 6A is that the gate of the MOS transistor MCS1 is connected to the input of the pre-amplifier PRAMP so that the detect and cancel circuit of power supply current variation COVVI takes the input voltage of the pre-amplifier PRAMP as an input. Also in the circuit configuration shown in FIG. 6B, the current variation of the pre-amplifier PRAMP is proportional to the received current; therefore, even when the input voltage is used, the power supply current variation can be detected. Therefore, this circuit also has similar configurations as FIG. 6A except for the function of detecting the power supply current change. Therefore, as well as FIG. 6A, when the received current Iin and the current of the constant current source ISC1 are adjusted to be mutually the same, the current changes are cancelled with each other, and almost no variation is caused.

<Effect of Reducing Output Noise by Changing Power Supply Current>

Figure 7:
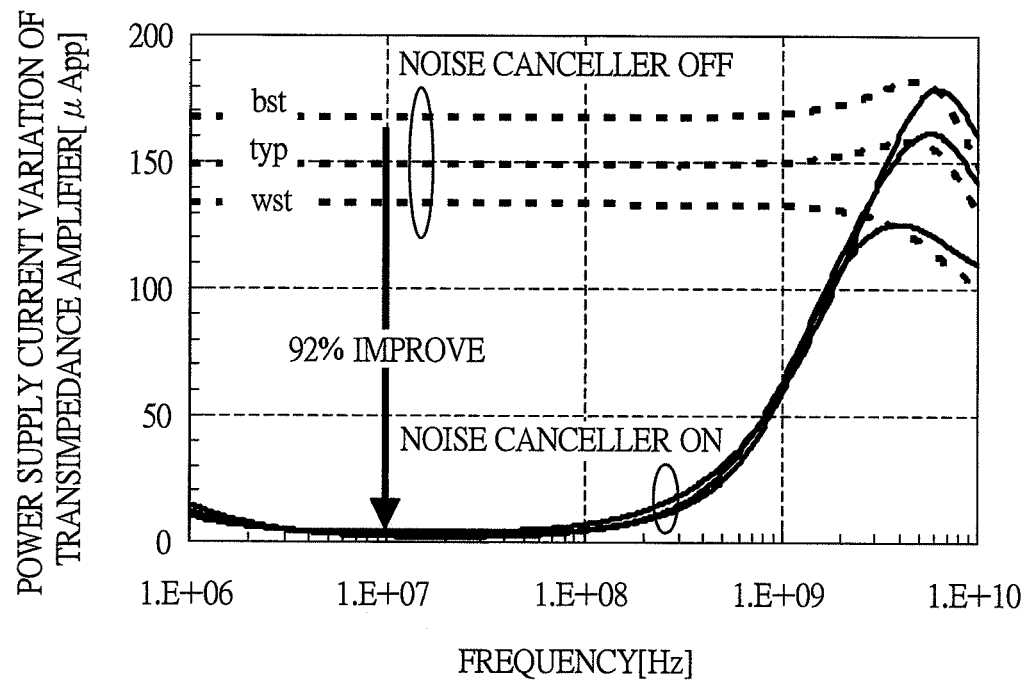
FIG. 7 is an explanatory diagram showing an example of an effect of reducing output noise by changing the power-supply voltage when the transimpedance amplifier in above-described

FIG. 7 is an explanatory diagram showing an example of the effect of reducing the output noise by changing the power supply voltage when the transimpedance amplifier TIA shown in above-described FIG. 6A is applied. FIG. 7 is an example in which the circuit of the example shown in FIG. 6A is designed by using a CMOS device of 65 nm, and the frequency dependency of the output current change of the regulator REG is obtained. The vertical axis shows variation in the output current of the regulator REG (power-supply noise current [μApp]) in the transimpedance amplifier TIA, and the horizontal axis shows the frequency [Hz] of the received signal. In FIG. 7, broken lines show a situation in which the detect and cancel circuit of power supply current variation COVVI is not operated (noise canceller OFF, bst: best, typ: type, wst: worst), and solid lines show a situation in which the detect and cancel circuit of power supply current variation COVVI is operated (noise canceller ON).

According to FIG. 7, it can be understood that the effect of reducing the noise caused by the received current generated in the output of the pre-amplifier PRAMP generated in a receiving operation can be obtained when the frequency component of the received current is several hundreds of MHz (1.E+08) or lower. In the example of FIG. 7, when the detect and cancel circuit of power supply current variation COVVI was operated, an effect of 92% improvement was obtained compared with the case in which the circuit is not operated. The cause that increases the noise at a frequency of several hundreds of MHz or higher is that the operating band of the detect and cancel circuit of power supply current variation COVVI is several hundreds of MHz. Therefore, this can be solved by increasing the operating band of the detect and cancel circuit of power supply current variation COVVI. Furthermore, as described above, regarding the noise of this frequency band, the voltage variation caused by the current variation thereof can be absorbed by the bypass capacitor Cb provided at the output of the regulator REG of the power circuit PSPY described in the present embodiment.

The effect shown in FIG. 7 of reducing the output noise by changing the power-supply voltage can be similarly obtained also when the transimpedance amplifier TIA shown in above-described FIG. 6B is used instead of the transimpedance amplifier TIA shown in FIG. 6A.

Effects of the Third Embodiment

As described above, according to the third embodiment, in the power circuit PSPY constituting the transimpedance amplifier TIA, the detect and cancel circuit of power supply current variation COVVI in the power circuit PSPY is composed of the MOS transistors MCS1 and MCS2, the constant current source ISC1, the resistance Rlp, and the capacitor Clp; as a result, effects similar to those of the above-described first embodiment are obtained, the effect of reducing the noise caused by the received current can be particularly obtained by increasing the operating band of the detect and cancel circuit of power supply current variation COVVI, and, furthermore, the voltage variation caused by the current variation can be absorbed by the bypass capacitor Cb.

Fourth Embodiment

A fourth embodiment of the present invention will be described with reference to FIG. 8. The fourth embodiment is an example showing, in detail, the circuit configuration of the detect and cancel circuit of power supply current variation COVVI constituting the power circuit PSPY of the above-described second embodiment, and this is an example different from FIGS. 6A and 6B of the above-described third embodiment.

In the fourth embodiment, the current switch circuit constituting the current adding circuit (detect and cancel circuit of power supply current variation COVVI) is characterized by having the first field effect transistor (MOS transistor MCS1) and the second field effect transistor (MOS transistor MCS2), having the gate of the second field effect transistor being connected to the output of the automatic decision threshold control ATC.

<Transimpedance Amplifier>

Figure 8:
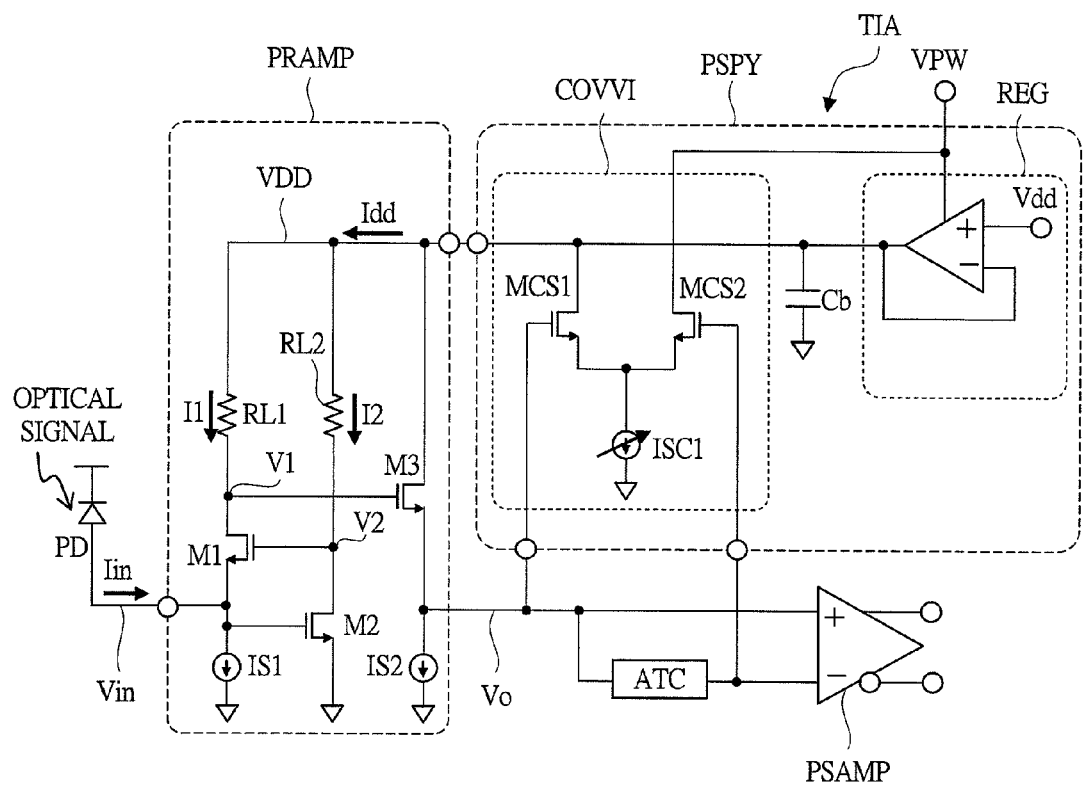
FIG. 8 is a circuit diagram showing an example of a circuit configuration of a pre-amplifier and a power circuit (another specific example of the detect and cancel circuit of power supply current variation) constituting a transimpedance amplifier in a router device according to a fourth embodiment of the present invention.

FIG. 8 is a circuit diagram showing an example of a circuit configuration of the pre-amplifier PRAMP and the power circuit PSPY (another specific example of the detect and cancel circuit of power supply current variation COVVI) constituting the transimpedance amplifier TIA in a router device according to the fourth embodiment. FIG. 8 shows a configuration example different from that of the detect and cancel circuit of power supply current variation COVVI shown in FIGS. 6A and 6B.

In the transimpedance amplifier TIA shown in FIG. 8, the input of a differential circuit constituting the detect and cancel circuit of power supply current variation COVVI is connected to a differential input terminal of the post-amplifier PSAMP (the gate of the MOS transistor MCS1 is connected to the positive-electrode-side input terminal of the post-amplifier PSAMP, and the gate of the MOS transistor MCS2 is connected to the negative-electrode-side input terminal of the post-amplifier PSAMP. From a different viewpoint, the gate of the MOS transistor MCS1 is connected to the input of the automatic decision threshold control ATC, and the gate of the MOS transistor MCS2 is connected to the output of the automatic decision threshold control ATC), where the function of the low pass filter provided in the detect and cancel circuit of power supply current variation COVVI in the circuit of FIGS. 6A and 6B is also served by the automatic decision threshold control ATC. Also in this circuit, the detect and cancel circuit of power supply current variation COVVI has the same function as the circuits shown in above-described FIGS. 6A and 6B. Therefore, the same operation and effects can be obtained.

FIG. 8 shows the circuit configuration in which the current variation ΔIdd of the pre-amplifier PRAMP is detected by the output voltage of the pre-amplifier PRAMP; however, a circuit configuration in which the current variation ΔIdd of the pre-amplifier PRAMP is detected by the input voltage of the pre-amplifier PRAMP also similarly works.

Effects of the Fourth Embodiment

As described above, according to the fourth embodiment, in the detect and cancel circuit of power supply current variation COVVI in the power circuit PSPY constituting the transimpedance amplifier TIA, the gate of the MOS transistor MCS2 of the current switch circuit is connected to the output of the automatic decision threshold control ATC. As a result, effects similar to those of the above-described first embodiment can be obtained, and, particularly, the function of the low pass filter can be also served by the automatic decision threshold control ATC.

Fifth Embodiment

A fifth embodiment of the present invention will be described with reference to FIG. 9. The fifth embodiment is an example showing, in detail, a circuit configuration of the detect and cancel circuit of power supply current variation COVVI constituting the power circuit PSPY of the above-described second embodiment, and this is an example different from the circuit configurations in FIGS. 6A and 6B of the above-described third embodiment and in FIG. 8 of the above-described fourth embodiment.

In the fifth embodiment, the current adding circuit (the detect and cancel circuit of power supply current variation COVVI) is characterized by having a field effect transistor (MOS transistor MPS1) and a resistance (resistance REPS1) which can be set to an optional resistance value. The circuit is composed of a source-grounded amplifier circuit in which the source of the field effect transistor is grounded by the resistance, and the drain thereof is connected to the output of the regulator REG.

<Transimpedance Amplifier>

FIG. 9 is a circuit diagram showing an example of a circuit configuration of the pre-amplifier PRAMP and the power circuit PSPY (further another specific example of the detect and cancel circuit of power supply current variation COVVI) constituting the transimpedance amplifier TIA in a router device in the fifth embodiment. FIG. 9 shows the configuration example which is further different from the detect and cancel circuits COVVI of power supply current variation shown in FIGS. 6A and 6B and the detect and cancel circuit of power supply current variation COVVI shown in FIG. 8.

In the transimpedance amplifier TIA shown in FIG. 9, in the power circuit PSPY, the detect and cancel circuit of power supply current variation COVVI is composed of the source-grounded amplifier circuit which cancels out the power supply current variation by detecting, by the input voltage of the pre-amplifier PRAMP, the varied current flowing to the supply terminal of the pre-amplifier PRAMP and outputting a reverse-phase current of the varied current. The source-grounded amplifier circuit is composed of the MOS transistor MPS1 and the resistance REPS1 which can be set to an optional resistance value, the source of the MOS transistor MPS1 is grounded by the resistance REPS1, the drain thereof is connected to the output of the regulator REG, and the gate thereof is connected to the input of the pre-amplifier PRAMP. In this circuit, when the current that cancels out the power supply current variation is adjusted by the resistance REPS1, the output current change of the regulator REG can be reduced, and the output noise of the pre-amplifier PRAMP caused by a receiving operation can be reduced.

FIG. 9 shows the circuit configuration in which the current variation ΔIdd of the pre-amplifier PRAMP is detected by the input voltage of the pre-amplifier PRAMP; however, the circuit configuration in which the current variation ΔIdd of the pre-amplifier PRAMP is detected by the output voltage of the pre-amplifier PRAMP also similarly works.

Effects of the Fifth Embodiment

As described above, according to the fifth embodiment, in the power circuit PSPY constituting the transimpedance amplifier TIA, the detect and cancel circuit of power supply current variation COVVI in the power circuit PSPY is composed of the MOS transistor MPS1 and the resistance REPS1. As a result, effects similar to those of the above-described first embodiment are obtained; and, particularly when the current that cancels out the power supply current variation is adjusted by the resistance REPS1, the output current change of the regulator REG can be reduced, and the output noise of the pre-amplifier PRAMP caused by a receiving operation can be reduced.

In the foregoing, the invention made by the inventors of the present invention has been concretely described based on the embodiments. However, it is needless to say that the present invention is not limited to the foregoing embodiments and various modifications and alterations can be made within the scope of the present invention.

Note that the transimpedance amplifier of the present invention relates to an optical module including the transimpedance amplifier and to an optical communication apparatus including the optical module. The transimpedance amplifier is particularly beneficial when applied to the optical module and a router device which carry out communications via optical fiber cables in the apparatus, and the transimpedance amplifier can be widely applied not only to these but also to an optical communication apparatus such as a server device and generally to an optical module product which is one of the parts of the optical communication apparatus and carries out optical communications by using a laser diode and a photo diode.

What is claimed is:

1. A transimpedance amplifier comprising:
a pre-amplifier, having a voltage supply terminal, an input for a single-end current signal and an output for a single-end voltage signal, for converting the single-end current signal to the single-end voltage signal;
an automatic decision threshold control circuit for detecting a center electric potential of the single-end voltage signal;
a post-amplifier for differentiating and amplifying the single-end voltage signal; and
a power circuit for supplying power to the pre-amplifier, including:
a regulator, having an output, for supplying a power supply voltage to the pre-amplifier voltage supply terminal, and
a current adding circuit for detecting, based on the pre-amplifier input or output signal, a first current variation flowing to the pre-amplifier voltage supply terminal, and for adding a second current variation, having a phase opposite to the phase of the first current variation, to the regulator output.

2. The transimpedance amplifier according to claim 1, wherein the power circuit further includes:
a bypass capacity provided at the output of the regulator.

3. The transimpedance amplifier according to claim 2, wherein
the current adding circuit has a constant current source adjustable to an optional current value and a current switch circuit;
a terminal of the current switch circuit is connected to the output of the regulator;
another terminal of the current switch circuit is connected to a first supply terminal;
depending on the state of the input signal or the output signal of the pre-amplifier, a current of the constant current source is added to an output current of the regulator via the current switch circuit so as to have a phase opposite to that of the first current variation that flows to the voltage supply terminal of the pre-amplifier.

4. The transimpedance amplifier according to claim 3, wherein
the current switch circuit has a first field effect transistor and a second field effect transistor respectively having source terminals connected to each other, the first and second field effect transistors being connected to the constant current source;
a drain of the first field effect transistor is connected to the output of the regulator;
a drain of the second field effect transistor is connected to the first supply terminal;
a gate of the first field effect transistor is connected to an output having a same phase as an input electric-potential variation of the pre-amplifier.

5. The transimpedance amplifier according to claim 4, wherein a gate of the second field effect transistor is connected to the output of the pre-amplifier via a low pass filter.

6. The transimpedance amplifier according to claim 4, wherein a gate of the second field effect transistor is connected to an output of the automatic decision threshold control circuit.

7. The transimpedance amplifier according to claim 2, wherein the current adding circuit is composed of a source-grounded amplifier circuit having a field effect transistor and a resistance that can be set to an optional resistance value, having a source of the field effect transistor being grounded by the resistance, and a drain of the field effect transistor being connected to the output of the regulator.

8. A semiconductor device comprising:
a laser diode driver driving a laser diode;
a transimpedance amplifier amplifying and converting a current signal from a photo diode to a voltage signal; and
a speed converter circuit converting a transmission speed of an input/output signal to/from the laser diode driver and the transimpedance amplifier and the transmission speed of an input/output signal to/from outside,
wherein the laser diode driver, the transimpedance amplifier, and the speed converter circuit are formed on a single semiconductor chip; and
wherein the transimpedance amplifier includes:
a pre-amplifier, having a voltage supply terminal, an input for a single-end current signal from the photo diode and an output for a single-end voltage signal, for converting the single-end current signal to the single-end voltage signal;

an automatic decision threshold control circuit for detecting a center electric potential of the single-end voltage signal;

a post-amplifier for differentiating and amplifying the single-end voltage signal, and for outputting the differentiated and amplified signal to the speed converter circuit; and a power circuit for supplying power to the pre-amplifier, including:
- a regulator, having an output, for supplying a power supply voltage to the pre-amplifier voltage supply terminal, and
- a current adding circuit for detecting, based on the pre-amplifier input or output signal, a first current variation flowing to the pre-amplifier voltage supply terminal, and for adding a second current variation, having a phase opposite to the phase of the first current variation, to the regulator output.

9. The semiconductor device according to claim 8, wherein the power circuit further includes:
a bypass capacity provided at the output of the regulator.

10. The semiconductor device according to claim 9, wherein
the current adding circuit has a constant current source adjustable to an optional current value and a current switch circuit;
a terminal of the current switch circuit is connected to the output of the regulator;
another terminal of the current switch circuit is connected to a first supply terminal;
depending on the state of the input signal or the output signal of the pre-amplifier, a current of the constant current source is added to an output current of the regulator via the current switch circuit so as to have a phase opposite to that of the first current variation that flows to the voltage supply terminal of the pre-amplifier.

11. The semiconductor device according to claim 10, wherein
the current switch circuit has a first field effect transistor and a second field effect transistor respectively having source terminals connected to each other, the first and second field effect transistors being connected to the constant current source;
a drain of the first field effect transistor is connected to the output of the regulator;
a drain of the second field effect transistor is connected to the first supply terminal;
a gate of the first field effect transistor is connected to an output having a same phase as an input electric-potential variation of the pre-amplifier.

12. The transimpedance amplifier according to claim 11, wherein a gate of the second field effect transistor is connected to the output of the pre-amplifier via a low pass filter or connected to an output of the automatic decision threshold control circuit.

13. The semiconductor device according to claim 9, wherein the current adding circuit is composed of a source-grounded amplifier circuit having a field effect transistor and a resistance that can be set to an optional resistance value, having a source of the field effect transistor being grounded by the resistance, and a drain of the field effect transistor being connected to the output of the regulator.

14. An optical module comprising:
an optical element device; and
a semiconductor device,
wherein the optical element device and the semiconductor device are mounted on a single package;
wherein the optical element device includes a photo diode and a laser diode;
wherein the photo diode and the laser diode are formed on a single semiconductor chip;
wherein the semiconductor device includes:
the laser diode driver driving the laser diode;
a transimpedance amplifier amplifying and converting a current signal from the photo diode to a voltage signal; and
a speed converter circuit converting a transmission speed of an input/output signal to/from the laser diode driver and the transimpedance amplifier and the transmission speed of an input/output signal to/from outside;
wherein the laser diode driver, the transimpedance amplifier, and the speed converter circuit are formed on a single semiconductor chip; and
wherein the transimpedance amplifier includes:
a pre-amplifier, having a voltage supply terminal, an input for a single-end current signal from the photo diode and an output for a single-end voltage signal, for converting the single-end current signal to the single-end voltage signal;
an automatic decision threshold control circuit for detecting a center electric potential of the single-end voltage signal;
a post-amplifier for differentiating and amplifying the single-end voltage signal, and for outputting the differentiated and amplified signal to the speed converter circuit; and
a power circuit for supplying power to the pre-amplifier, including:
a regulator, having an output, for supplying a power supply voltage to the pre-amplifier voltage supply terminal; and
a current adding circuit for detecting, based on the pre-amplifier input or output signal, a first current variation flowing to the pre-amplifier voltage supply terminal, and for adding a second current variation, having a phase opposite to the phase of the first current variation, to the regulator output.

15. The optical module according to claim 14, wherein the power circuit further includes:
a bypass capacity provided at the output of the regulator.

16. The optical module according to claim 15, wherein
the current adding circuit has a constant current source adjustable to an optional current value and a current switch circuit; a terminal of the current switch circuit is connected to the output of the regulator;
another terminal of the current switch circuit is connected to a first supply terminal;
depending on the state of the input signal or the output signal of the pre-amplifier, a current of the constant current source is added to an output current of the regulator via the current switch circuit so as to have a phase opposite to that of the first current variation that flows to the voltage supply terminal of the pre-amplifier.

17. The optical module according to claim 16, wherein
the current switch circuit has a first field effect transistor and a second field effect transistor respectively having source terminals connected to each other, the first and second field effect transistors being connected to the constant current source;
a drain of the first field effect transistor is connected to the output of the regulator;
a drain of the second field effect transistor is connected to the first supply terminal;

a gate of the first field effect transistor is connected to an output having a same phase as an input electric-potential variation of the pre-amplifier.

18. The optical module according to claim 17, wherein a gate of the second field effect transistor is connected to the output of the pre-amplifier via a low pass filter or connected to an output of the automatic decision threshold control circuit.

19. The optical module according to claim 15, wherein the current adding circuit is composed of a source-grounded amplifier circuit having a field effect transistor and a resistance that can be set to an optional resistance value, having a source of the field effect transistor being grounded by the resistance, and a drain of the field effect transistor being connected to the output of the regulator.

* * * * *